US012669551B2

(12) United States Patent
Arzberger

(10) Patent No.: US 12,669,551 B2
(45) Date of Patent: Jun. 30, 2026

(54) METHOD FOR DETERMINING A LOSS OF CAPACITY OF A BATTERY STORAGE DEVICE, APPARATUS, AND COMPUTER PROGRAM PRODUCT

(71) Applicant: Siemens Aktiengesellschaft, Munich (DE)

(72) Inventor: Arno Arzberger, Stegaurach (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 442 days.

(21) Appl. No.: 17/866,686

(22) Filed: Jul. 18, 2022

(65) Prior Publication Data

US 2023/0028368 A1     Jan. 26, 2023

(30) Foreign Application Priority Data

Jul. 23, 2021     (EP) ..................................... 21187494

(51) Int. Cl.
G01R 31/392 (2019.01)
G01R 31/36 (2020.01)
G01R 31/367 (2019.01)

(52) U.S. Cl.
CPC ....... G01R 31/392 (2019.01); G01R 31/3648 (2013.01); G01R 31/367 (2019.01)

(58) Field of Classification Search
CPC .............. G01R 31/3648; G01R 31/367; G01R 31/382; G01R 31/386; G01R 31/392;
(Continued)

(56) References Cited

U.S. PATENT DOCUMENTS

| | | | | |
|---|---|---|---|---|
| 6,307,377 | B1 | 10/2001 | Cummings et al. | .......... 324/427 |
| 6,526,361 | B1 | 2/2003 | Jones et al. | ...................... 702/63 |

(Continued)

FOREIGN PATENT DOCUMENTS

| | | | | |
|---|---|---|---|---|
| CN | 104272127 A | 1/2015 | ............. | G01R 31/36 |
| CN | 111007413 A | 4/2020 | ........... | G01R 31/385 |

(Continued)

OTHER PUBLICATIONS

U.S. Non-Final Office Action, U.S. Appl. No. 17/866,733, 12 pages, Aug. 16, 2024.

(Continued)

*Primary Examiner* — Andrew Schechter
*Assistant Examiner* — Joshua L Forristall
(74) *Attorney, Agent, or Firm* — Slayden Grubert Beard PLLC

(57)          ABSTRACT

Various embodiments include a method for ascertaining a mean capacity loss of a battery storage device. The method may include: providing results of a measurement series on the battery storage device taken during a plurality of load cycles, each including a charging and a discharging phase; ascertaining a first and a second discharge capacity of the device using a first and a second calculation rule, wherein each calibration is different for correcting values of the current measurement; and carrying out an optimization process so a calibration of the current measurement is ascertained to achieve the greatest match of the ascertained first discharge capacity and the second discharge capacity.

13 Claims, 3 Drawing Sheets

(58) Field of Classification Search

CPC ........... G01R 19/16528; G01R 31/374; G01R 31/3842; G01R 31/396; Y02E 60/10; H01M 10/48

USPC ......................................................... 702/63

See application file for complete search history.

(56) References Cited

U.S. PATENT DOCUMENTS

| | | | |
|---|---|---|---|
| 7,928,735 B2 | 4/2011 | Huang et al. ................. | 324/426 |
| 8,912,761 B2 | 12/2014 | Izumi ............................ | 320/148 |
| 11,422,199 B1 * | 8/2022 | Xu ........................ G01R 31/392 | |
| 11,486,932 B2 * | 11/2022 | Delaille ............... G01R 31/382 | |
| 2006/0250137 A1 | 11/2006 | Frey et al. ..................... | 324/426 |
| 2008/0265840 A1 | 10/2008 | De Paula et al. ............. | 320/132 |
| 2012/0215472 A1 | 8/2012 | Tezuka et al. .................. | 702/63 |
| 2012/0310565 A1 | 12/2012 | Redey ............................ | 702/63 |
| 2013/0234672 A1 | 9/2013 | Kubota et al. ................. | 320/134 |
| 2013/0325279 A1 | 12/2013 | Fujimoto et al. ............... | 701/74 |
| 2014/0095090 A1 | 4/2014 | Chen et al. ..................... | 702/63 |
| 2014/0257725 A1 | 9/2014 | Creff et al. ..................... | 702/63 |
| 2015/0115970 A1 | 4/2015 | Most et al. .................... | 324/427 |
| 2015/0160302 A1 | 6/2015 | Xu et al. ........................ | 324/427 |
| 2015/0301118 A1 | 10/2015 | Tao et al. | |
| 2016/0109526 A1 | 4/2016 | Geffin et al. .................. | 702/189 |
| 2016/0109528 A1 | 4/2016 | Schleicher et al. ........... | 324/430 |
| 2017/0115355 A1 | 4/2017 | Willard et al. .................. | 702/63 |
| 2017/0153292 A1 | 6/2017 | Steiber et al. ................ | 324/426 |
| 2018/0017628 A1 | 1/2018 | Takegami et al. | |
| 2020/0278399 A1 * | 9/2020 | Zhang .................. G07C 5/0825 | |
| 2020/0284846 A1 | 9/2020 | Pajovic et al. | |
| 2020/0341064 A1 | 10/2020 | Miftahullatif et al. | |
| 2021/0116513 A1 * | 4/2021 | Du ........................ H01M 10/48 | |
| 2022/0120815 A1 | 4/2022 | Wei et al. | |
| 2022/0214399 A1 | 7/2022 | Liaw et al. | |
| 2023/0028368 A1 | 1/2023 | Arzberger | |
| 2023/0031420 A1 | 2/2023 | Arzberger et al. | |
| 2023/0194624 A1 | 6/2023 | Hinterbrandner et al. | |

FOREIGN PATENT DOCUMENTS

| | | | | |
|---|---|---|---|---|
| CN | 112582696 A | 3/2021 | ............ | H01M 10/44 |
| DE | 10328721 A1 | 1/2005 | ............ | G01R 31/36 |
| DE | 102014220914 A1 | 4/2016 | ............ | G01R 27/02 |
| EP | 4063882 A1 | 9/2022 | ............ | G01R 31/367 |
| JP | 2011222343 A | 11/2011 | ............ | H01M 10/48 |
| JP | 2012122787 A | 6/2012 | ............ | G01R 31/36 |
| JP | 2013249026 A | 12/2013 | ............ | B60K 35/00 |
| JP | 2017067788 A | 4/2017 | ............ | G01R 31/36 |
| JP | 2017083474 A | 5/2017 | ............ | G01R 31/36 |
| JP | 2017099221 A | 6/2017 | ............ | G01R 31/36 |
| JP | 6494840 | 4/2019 | ............ | H01M 10/54 |
| JP | 2022182460 A | 12/2022 | ........ | G01R 31/3828 |
| JP | 2023016707 A | 2/2023 | ............ | G01R 31/382 |
| JP | 7423697 B2 | 1/2024 | ............ | G01R 31/367 |

| | | | | |
|---|---|---|---|---|
| WO | 83/02005 A1 | 6/1983 | ............ | G01R 31/36 |
| WO | 2019/142550 A1 | 7/2019 | ............ | G01R 31/36 |
| WO | 2021/089786 A1 | 5/2021 | ........... | G01R 31/367 |

OTHER PUBLICATIONS

Japanese Notice of Allowance, Application No. 2022101471, 7 pages, Dec. 19, 2023.

Zheng, Yuejiu et al: "Study on the correlation between state of charge and coulombic efficiency for commercial lithium ion batteries", Journal of Power Sources, Elsevier, Amsterdam, NL, vol. 289, pp. 81-90, XP029242205, May 18, 2015.

Zhang, Shuzhi et al: "A rapid online calculation method for state of health of lithium-ion battery based on coulomb counting method and differential voltage analysis"; Journal of Power Sources, Elsevier, Amsterdam, NL; vol. 479, XP086345101, Aug. 31, 2020.

Smith, A.J. et al., "Precision Measurements of the Coulombic Efficiency of Lithium-Ion Batteries and of Electrode Materials for Lithium-Ion Batteries," Journal of the Electrochemical Society, vol. 157, No. 2, 7 pages, Dec. 17, 2009.

Smith, A.J. et al., "Interpreting High Precision Coulometry Results on Li-ion Cells, " Journal of the Electrochemical Society, vol. 158, No. 10, 7 pages, Aug. 15, 2011.

Fleischauer, M.D. et al., "Calibration Process for Rechargeable Cell and Battery Test Systems," Review of Scientific Instruments, vol. 90, 8 pages, Apr. 9, 2019.

U.S. Final Office Action, U.S. Appl. No. 17/866,733, 21 pages, Jan. 29, 2024.

Japanese Office Action, Application No. 2022094914, 10 pages, Feb. 6, 2024.

Japanese Office Action, Application No. 2022101470, 8 pages, Oct. 3, 2023.

Japanese Office Action, Application No. 2022101471, 9 pages, Oct. 3, 2023.

U.S. Notice of Allowance, U.S. Appl. No. 17/866,652, 18 pages, Nov. 3, 2023.

Extended European Search Report, Application No. 21187494.6, 6 pages, Jan. 21, 2022.

Extended European Search Report, Application No. 21187495.3, 7 pages, Jan. 21, 2022.

U.S. Non-Final Office Action, U.S. Appl. No. 17/866,733, 23 pages, Aug. 2, 2023.

U.S. Notice of Allowance, U.S. Appl. No. 17/866,733, 14 pages, Jun. 21, 2024.

U.S. Notice of Allowance, U.S. Appl. No. 17/866,733, 18 pages, Nov. 25, 2024.

Chen, Lan, et al. "Estimation on the State of Charge of Lithium-Ion Battery by Correction Factors Ampere-Hour Method", Journal of Shanghai Institute of Technology (Natural) Science, vol. 14, No. 4, pp. 310-313 (Chinese w/ English abstract), Dec. 30, 2014.

Chinese Notice of Allowance, Application No. 2022108623039, 7 pages, Jul. 28, 2025.

* cited by examiner

METHOD FOR DETERMINING A LOSS OF CAPACITY OF A BATTERY STORAGE DEVICE, APPARATUS, AND COMPUTER PROGRAM PRODUCT

CROSS-REFERENCE TO RELATED APPLICATIONS

This application claims priority to EP Application No. 21187494.6 filed Jul. 23, 2021, the contents of which are hereby incorporated by reference in their entirety.

TECHNICAL FIELD

The present disclosure relates to battery storage devices. Various embodiments include methods for determining a loss of capacity of a battery storage device, in particular, the determination of an expected aging of the battery storage device, apparatuses for carrying out the method, and/or computer program products.

BACKGROUND

Lithium-ion accumulators, herein also called lithium-ion batteries, are used, due to their high power and energy density, as energy stores in mobile and static applications. In order to be able to operate these electrochemical energy stores safely, reliably and, for as long as possible, maintenance-free, the most accurate possible knowledge of critical operating states, in particular regarding the state of charge (SOC) and the aging condition or state of health (SOH) is necessary.

The aging of a battery, in particular what is known as cyclic aging, can be negatively influenced by high temperatures, rapid charging at low temperatures, dependent upon the state of charge and the depth of discharge and the charging power and discharge power. It is thus possible that the same type of battery cell can achieve a significantly different number of load cycles dependent upon the aforementioned parameters.

In order to determine the expected aging progression, in the prior art, an aging characteristic of the battery cell used is determined by means of measurements during the design phase of a battery system. The real aging speed with real load profiles is often not tested. Rather, in what are known as raff tests, the aging speed, or cycle stability, is determined from compressed load profiles. With these results, empirical aging models are parameterized, from which the aging progression emerges in the application. A progression of the future aging determined on the basis of physical and/or chemical measurements dependent upon the load profile, the operating point and the ambient conditions can be carried out only with difficulty due to the non-linearity of the underlying physical and chemical processes and their complex interactions.

An improved measurement of the capacity loss and estimation of the aging in actual operation is possible with a method of high-precision coulometry (HPC). In the HPC measurement, load cycles are performed and the capacity loss is ascertained from the progression of capacity measurements. In the HPC measurement, relatively small differences in the charge quantities that are loaded into the battery and are drawn from it are determined via the integration of measured current strengths. Therefore, the HPC measurement requires, in principle, a very high measuring accuracy, in particular for the current measurement. This high level of measuring accuracy can be maintained, if at all, only by test devices provided specifically for the HPC measurement.

SUMMARY

Typical test devices of the type that are used in battery production are not at all informative due to having excessively high measuring uncertainty. The teachings of the present disclosure include methods and apparatuses which enable an improvement of the intrinsic accuracy of HPC measurements. For example, some embodiments include a method for ascertaining at least one mean capacity loss of a battery storage device (2) comprising: providing results of a measurement series on the battery storage device (2) with a plurality of load cycles (100), wherein the load cycles (100) comprise a charging phase and a discharging phase and wherein the results comprise values of a current measurement, ascertaining a first and a second discharge capacity $(Q_{0,i}, Q_{meas,i})$ of the battery storage device (2) from the results of the measurement series by way of a first and a second calculation rule, wherein a calibration of the current measurement is included differently in the first and the second calculation rule, wherein the calibration is a calculation rule for correcting values of the current measurement, and carrying out an optimization process such that a calibration of the current measurement is ascertained with which the greatest match of the ascertained first and second discharge capacity $(Q_{0,i}, Q_{meas,i})$ is achieved.

In some embodiments, the first discharge capacity $(Q_{0,i})$ for a load cycle (100) is calculated from a discharge drift for the load cycle (100) and a coulomb efficiency for the load cycle (100).

In some embodiments, the first discharge capacity $(Q_{0,i})$ for a load cycle (100) is calculated from a capacity value after the charging phase of the load cycle (100) and a capacity value before said charging phase.

In some embodiments, the second discharge capacity $(Q_{meas,i})$ for a load cycle is ascertained from a first discharge capacity for a further preceding load cycle and a sum of capacity losses of load cycles arranged between the load cycle and the further load cycle.

In some embodiments, for the calculation and optimization of the calibration, an offset value is used which defines a difference between the real and the measured current value at a current of 0 A and a gradient value is used which defines a proportionality factor between the real and the measured current.

In some embodiments, for the calculation and optimization of the calibration, a curvature factor is used which defines a non-linear, in particular quadratic, relationship between the real and the measured current.

In some embodiments, for the calculation and optimization of the calibration, the relation between the real and the measured current is modelled as a partially linear relation with at least three interpolation points.

In some embodiments, the results of the measurement series are generated by means of a high precision coulometry apparatus (4).

In some embodiments, the charging and discharging of the load cycle (100) takes place between a lower voltage (26) and an upper voltage (25) of the battery storage device (2).

In some embodiments, in each successive load cycle (100), a constant temperature prevails within the load cycle.

In some embodiments, a first charge displacement is ascertained as the difference between a first upper state of charge (24) and a second upper state of charge (22) and in which a second charge displacement is determined as the difference between a first lower state of charge (23) and a second lower state of charge (21) and in which a capacity loss is determined from the difference between the first charge displacement and the second charge displacement.

In some embodiments, load cycles (100) are carried out until the capacity loss in two or more successive load cycles (100) is almost constant.

In some embodiments, the method takes place in a computer-assisted manner in a computing unit (10).

As another example, some embodiments include an apparatus (1) for carrying out one or more of the methods described herein. The apparatus may comprise: a memory store for receiving results of a measurement series on the battery storage device (2) with a plurality of load cycles (100), wherein the load cycles (100) comprise a charging phase and a discharging phase and wherein the results comprise values of a current measurement, and a computing unit (10), wherein the computing unit (10) is configured for calculating a first and a second discharge capacity ($Q_{0,i}$, $Q_{meas,i}$) of the battery storage device (2) from the results of the measurement series by way of a first and a second calculation rule, wherein a calibration of the current measurement is included differently in the first and the second calculation rule, wherein the calibration is a calculation rule for correcting values of the current measurement, and carrying out an optimization process such that a calibration of the current measurement is ascertained with which the greatest match of the ascertained first and second discharge capacity ($Q_{0,i}$, $Q_{meas,i}$) is achieved.

As another example, some embodiments include a computer program product (13) which can be directly loaded into a memory store of a programmable computing unit (10), having program code means in order to carry out one or more of the methods as described herein when the computer program product (13) is executed in the computing unit (10).

BRIEF DESCRIPTION OF THE DRAWINGS

Further features, properties, and advantages of various embodiments of the present disclosure are explained in the following description, making reference to the accompanying drawings. In the drawings, shown schematically.

DETAILED DESCRIPTION

Figures 1, 2:
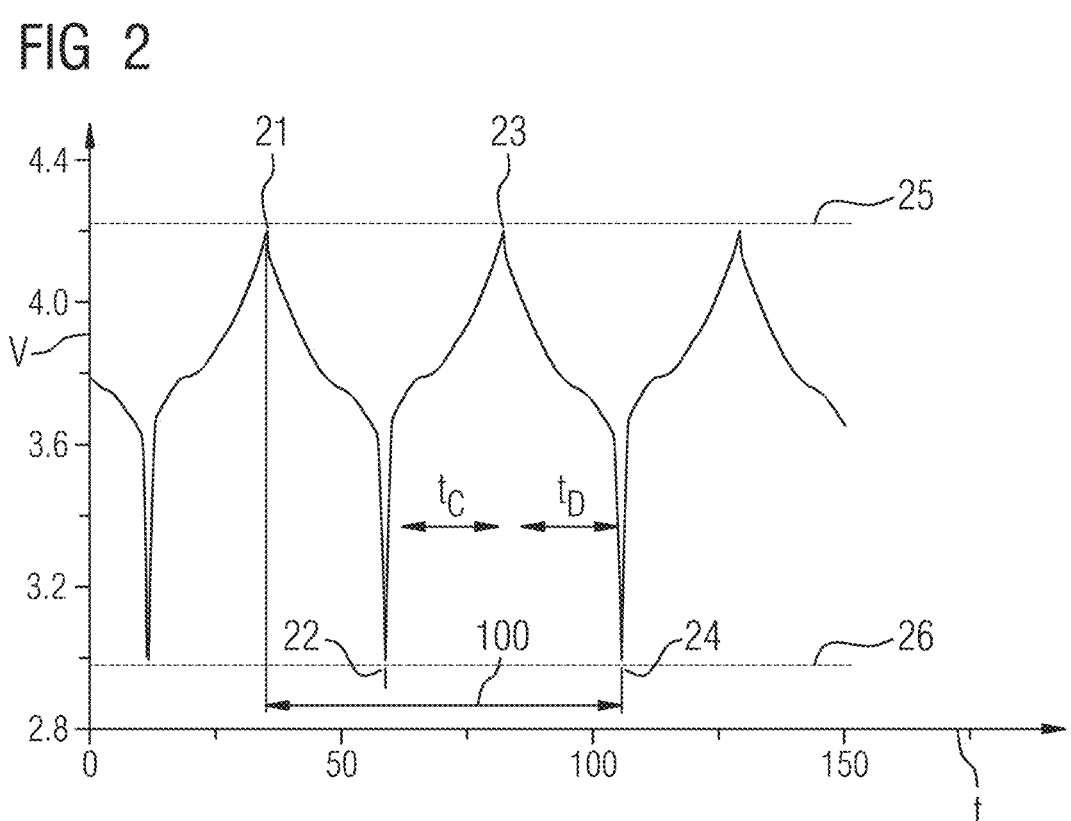
FIG. 1 shows an apparatus for determining the mean capacity loss and a residual capacity with a high precision coulometry apparatus incorporating teachings of the present disclosure.
FIG. 2 shows a voltage-time graph of a load cycle incorporating teachings of the present disclosure.

Some embodiments of the teachings herein include a method for ascertaining at least one mean capacity loss of a battery storage device. Results of a measurement series on the battery storage device with a plurality of load cycles are provided. The load cycles comprise a charging phase and a discharging phase. The results comprise values of a current measurement from the load cycles, that is the charging and the discharging.

From the results of the measurement series, a first and a second discharge capacity of the battery storage device is ascertained by way of a first and a second calculation rule. Such calculation rules are used so that a calibration of the current measurement is included differently in the first and the second calculation rule. The calibration is the relation between the actually present current and the value of the current measurement. Finally, an optimization process is carried out such that a calibration of the current measurement is ascertained with which the greatest matching of the ascertained first and second charging capacity is achieved.

An apparatus for carrying out the methods described herein comprises a memory store for receiving results of a measurement series on the battery storage device with a plurality of load cycles. The load cycles comprise a charging phase and a discharging phase and the results comprise values of a current measurement.

The apparatus further comprises a computing unit. This is configured to carry out a calculation of a first and a second discharge capacity of the battery storage device from the results of the measurement series by way of a first and a second calculation rule. A calibration of the current measurement is used differently in the first and the second calculation rule, wherein the calibration is the relation between the actually present current and the value of the current measurement.

The computing unit is further configured to carry out an optimization process such that a calibration of the current measurement is ascertained with which the greatest match of the ascertained first and second charging capacity is achieved.

The computer program products incorporating teachings of the present disclosure can be loaded directly into a memory store of a programmable computing unit. It comprises program code means in order to carry out one or more of the methods described herein when the computer program product is executed in the computing unit. In some embodiments, the optimization takes place in a computer-assisted manner in a computing unit.

In some embodiments, inaccuracies in the measurement of the battery properties, particularly in the form of the measurement of the charge quantities that arise from a faulty, that is imprecise, calibration of the current measurement, are removed. In some embodiments, from the current measurements that are recorded during a measurement of load cycles, at least two charge values can be determined which nominally match one another, but in which the calibration of the current measurement is included to a different extent in the result. By this means, the influence of the calibration can be eliminated.

In some embodiments, the measuring accuracy of HPC testers in particular is also increased. Those for which the calibration during production is too inaccurate can also be used in this way and calibrated exactly with the method according to the invention—during the measurement of a battery. Furthermore, even expressive HPC measurements on "standard testers" are enabled with which without the methods described herein, no meaningful measurement with the necessary accuracy would be possible.

The results of the measurement series therein comprise values of current measurements that are suitable for a summation that approaches an integration over time. In other words, what is concerned is a plurality of measurement values. The measurement values are typically present as electrical signals, for example, as digital signals. The results of the measurement series can also comprise voltage values, in particular voltage values that are associated with the current values.

In some embodiments, the optimization process minimizes a target function wherein for the minimization, particular parameters of the target function that are provided may be varied. Optimization processes typically function iteratively and cannot be replaced with an analytical solution. In the present case, for example, the target function to be minimized can be the amount of the difference between the first and the second charge capacity. The parameters to be varied are the parameters which represent the calibration of the current measurement.

The provision of the measurement results can be understood to mean that they are already present and are thus only received and processed. The actual measurement has already taken place in this case and can therefore take place separately in space and time. However, it is also possible that the measurement results are provided and processed immediately in the course of a measurement, that is, the measurement takes place together with the method.

In some embodiments, the first discharge capacity for a load cycle can be calculated from a discharge drift for the load cycle and a coulomb efficiency for the load cycle. For this purpose, for example, equation 3 below can be used as a calculation rule. The discharge drift should be understood as the difference between two successive charging states in the lower state of charge of the charging cycle, i.e. after the discharge, calculated for example by means of equation 5. The coulomb efficiency or coulombic efficiency describes the ratio of the energy removed by the discharging to the energy fed in through the prior charging; equation 4 can be used for this.

In some embodiments, the first discharge capacity for a load cycle can be calculated from a capacity value after the charging phase of the load cycle and a capacity value before said charging phase.

In some embodiments, the second discharge capacity for a load cycle can be ascertained from a first discharge capacity for a further preceding load cycle and a sum of capacity losses of load cycles arranged between the load cycle and the further load cycle. A corresponding equation for the calculation is set out as equation 6. The capacity losses should be understood to be the difference between the charge drift and the already used discharge drift, as set out in equation 7. Similarly to the discharge drift, the charge drift should be understood to be the difference between two successive charging states in the upper state of charge of the charging cycle, i.e. after the charging, calculated for example by means of equation 8.

In some embodiments, for the calculation and optimization of the calibration, an offset value can be used which defines a difference between the real and the measured current value at a current of 0 A. Furthermore, an gradient value which gives a proportionality factor between the real and the measured current can be used. This corresponds to a depiction of the current pattern by means of a first order polynomial, that is, a straight line. The real current can herein mean, for example, a raw electrical signal from a measurement.

A calibration of this type is simple and universal and represents the typical ratios of a current measurement. Therein, the offset corresponds to a zero value of an AD converter that is used, whereas the gradient value or gain maps the electrical resistance that is used as a shunt for the current measurement and the size thereof underlies an exemplary scatter and therefore does not correspond exactly to the specification.

In some embodiments, for the calculation and optimization of the calibration, a curvature factor can be used which defines a non-linear, in particular quadratic, relationship between the real and the measured current. Together with the offset and the gain, by this means, a second order polynomial, which permits a yet more exact adaptation to the real measurement, is generated.

In some embodiments, for the calculation and optimization of the calibration, the relation between the real and the measured current can be modelled as a partially linear relation with three or more interpolation points. This procedure enables a more accurate modeling than the simple straight line and, by increasing the number of interpolation points, in principle any desired level of accuracy that is entirely independent of the actual form of the relation between the real current and the measurement value.

In some embodiments, the results of the measurement series are generated by means of a high precision coulometry apparatus. These are specifically designed for this type of measurement and a still existing inaccuracy of the current measurement can ideally be compensated for with the method according to the invention.

In some embodiments, load cycles of this type are used in which the charging and discharging always takes place between a settable lower voltage and a settable upper voltage of the battery storage device. It is thereby ensured that in each successive load cycle, a constant temperature prevails within the load cycle. Thereby, temperature-related inaccuracies of the measurement are reduced.

In some embodiments, during the measurement, load cycles are performed until a capacity loss in two or more successive load cycles is almost constant. The capacity losses ascertained are regarded as almost constant if a gradient of a tangent that has been adapted to the profile of the capacity losses has a quantitative value that is less than 10% of the mean value of the gradients of the last 10% of the measured capacity losses. In some embodiments, the capacity losses are considered to be almost or substantially constant if an absolute change of at least two successive capacity losses amounts, in particular, to less than 5%.

For a further use of the measurement results, a mean capacity loss can be ascertained. This is found as the mean value of a plurality of capacity losses for different load cycles. The mean capacity loss defines the aging rate for a selected load cycle in the units of capacity loss per cycle. In some embodiments, a quantitative evaluation of the measurement data of the high precision coulometry apparatus can be undertaken with regard to the aging rate of the battery. The quantitative evaluation is possible since, on the basis of the ascertainment of the mean capacity loss, absolute values for the capacity can be ascertained. The load cycle used defines, through the selection of the voltage limits, a particular operating point characterized by a mean state of charge (SOC) and a cycle depth (DOD).

In some embodiments, the determination of the mean capacity loss takes place with computer assistance by means of a sliding linear fit over the values of the capacity loss and finding the smallest gradients in the straight line equations thus generated. Starting from a fit across all the capacity losses, the dataset which comprises the ascertained capacity losses is continuously shortened and fitted to a new straight line. The fit is carried out as far as a particular minimum residual length of the dataset, that is, the capacity losses. Thereafter, the straight line equations are sorted ascending by size according to the values of their gradients. The measurement can then be considered valid if at least two of the gradients have a quantitative value of less than 10% of the mean value of the last 10% of the capacity losses. If, for example, the mean value of the last twenty capacity losses, in particular where at least 200 capacity losses are measured, is 5 mAh/load cycle, then the gradient of the two best tangent fits should amount to less than 0.05 mAh/load cycle.

In some embodiments, capacity losses are utilized to ascertain the residual capacity only after a build-up time of the load cycle. Capacity losses which are ascertained at the start of the measurements, that is, during the build-up procedure, are error-prone and therefore should not be included in the determination of the mean capacity loss. It has been found that this build-up phase is ended when at least two of the straight lines applied in a fit to the capacity loss have gradients quantitatively smaller than 10% of the mean value of the last 10% of the measured capacity losses. In some embodiments, the capacity losses are regarded as almost constant if two successive capacity losses and/or a sliding mean value over at least 20 capacity losses have a change of less than 5% as a capacity loss. In some embodiments, this procedure ensures that the ascertainment of the residual capacity on the basis of the capacity loss can be carried out rapidly but nevertheless reliably.

In some embodiments, in each successive load cycle within a determination of the capacity loss, a constant temperature prevails. In other words, this means that the temperature can be different in two successive determinations of the capacity loss. However, the temperature during a load cycle is constant. In some embodiments, therefore, load cycles that have been recorded at different temperatures can be combined for the determination of the mean capacity loss, provided the temperature has remained constant within a load cycle.

In some embodiments, the battery or battery cell can be operated in a temperature-controlled chamber. In particular, the temperature-controlled chamber enables a sufficient level of temperature stability during a load cycle of the battery. In some embodiments, it is possible to stabilize the temperature of the battery storage device by means of a contacting temperature regulator and/or a cooling circuit. In some embodiments, the use of temperature control ensures that the temperature remains constant during a determination of the capacity loss. This increases the reliability of the determination of the residual capacity of the battery storage device.

In some embodiments, the lower voltage is selected from a first voltage range and the upper voltage is selected from a second voltage range. The second voltage range suitably lies at higher voltages than the first voltage range. In some embodiments, both the first voltage range and also the second voltage range can be selected from the whole working voltage range of the battery storage device. In other words, complete cycles do not have to be carried out. It is therefore possible to use the permitted voltage range of the battery storage device as per the product datasheet or therebeyond. In some embodiments, the measurement of the capacity loss without performing complete cycles, that is, complete charging and discharging, enables a shorter measuring time. Furthermore, the battery storage device is less severely loaded by the measurement, which advantageously prevents rapid aging.

In some embodiments, for the determination of the mean capacity loss, the sliding mean value is ascertained from at least 20 capacity losses.

FIG. 1 shows an apparatus for determining the mean capacity loss and the residual capacity with a high precision coulometry apparatus 1 incorporating teachings of the present disclosure. The apparatus 1 comprises a battery storage device 2 wherein the battery storage device has at least one battery cell. The battery storage device is arranged in a temperature-controlled chamber 3. The battery storage device 2 is connected via a power cable 11 to a high precision coulometry apparatus 4. The high precision coulometry apparatus 4 is in turn connected to a computing unit 10 via a data cable 12. The high precision coulometry apparatus 4 records, with very high accuracy, a charge-time graph of the battery storage device 2. The battery storage device 2 is therein operated with a periodic load cycle 100.

FIG. 2 shows a voltage-time graph which the high-precision coulometry apparatus 4 has recorded during a periodic load cycle 100 of the battery storage device 2 incorporating teachings of the present disclosure. A load cycle 100 comprises a discharging from a first state of charge 21 to a second state of charge 22, wherein the first state of charge 21 is at an upper voltage 25 and the second state of charge 22 is at a lower voltage 26. Subsequently, in the load cycle 100, the battery storage device 2 is charged from the second state of charge 22 to a third state of charge 23. As a next step in the load cycle 100, discharging takes place from the third state of charge 23 to a fourth state of charge 24. In each individual charging/discharging step, an upper voltage 25 and a lower voltage 26 are maintained as voltage limits. The charging lasts for the charging period $t_C$. The discharging lasts for the discharging period $t_D$.

On the basis of the measurement shown in FIG. 2, it can now be ascertained what cumulative charge quantity has flowed in the individual charging and discharging steps. The first charge quantity Q1 can be calculated with equation 1, where I is the current flow and $t_D$ is the discharging period:

$$Q1 = \int I dt_D \qquad \text{Equation 1}$$

Subsequently within the load cycle 100, the battery storage device 2 is charged from the second state of charge 22 to the third state of charge 23 by means of a first charging 32. A second charge quantity Q2 is loaded into the battery storage device 2. Q2 can be calculated with equation 2:

$$Q2 = \int I dt_C \qquad \text{Equation 2}$$

Subsequently within the load cycle 100, the battery storage device 2 is discharged from the third state of charge 23 to the fourth state of charge 24 by means of a second discharging 33. The charge quantity Q3 removed can in turn be calculated similarly to equation 1 from the time period of the discharging and the associated current flow.

Figure 3:
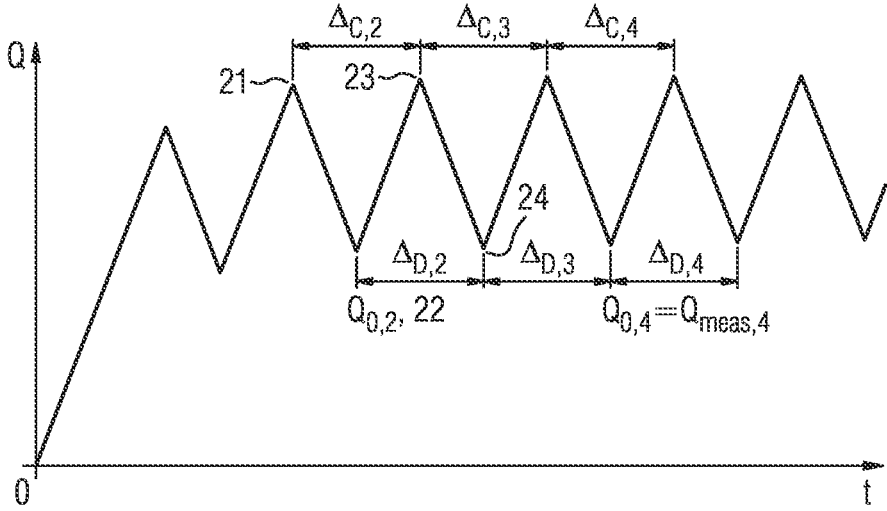
FIG. 3 shows a graph of the temporal profile of the absolute charge balance incorporating teachings of the present disclosure.

FIG. 3 shows a schematic and highly simplified graph in which the progression of the charge quantities Q1 . . . 3 ascertained in this way is entered over time incorporating teachings of the present disclosure. For the further procedure, particular emphasis should be placed on the discharge capacities $Q_{0,i}$, for example $Q_{0,2}$ and $Q_{0,4}$ shown in FIG. 3. These discharge capacities can be determined in two different ways with the equations set out below.

In a first calculation form, the discharge capacity $Q_{0,i}$ is ascertained with equation 3. In all the equations below, the index i always indicates a time point of the charging in the i-th load cycle and the index j always indicates a time point of discharging following this time point of charging in the same load cycle.

$$Q_{0,i} = \frac{\Delta_{D,j}}{1 - CE_i} \qquad \text{Equation 3}$$

Herein, $CE_i$ again denotes the coulomb efficiency for the relevant cycle of charging and discharging, that is, the ratio of charge removed to the previously fed-in charge, according to equation 4.

$$CE_i = \frac{Q_i - Q_j}{Q_i - Q_{j-1}} \qquad \text{Equation 4}$$

$\Delta_{D,j}$ denotes the discharge drift. This is calculated as per equation 5 and gives the difference between two successive discharge states $Q_j$ and $Q_{j-1}$:

$$\Delta_{D,j} = Q_j - Q_{j-1} \qquad \text{Equation 5}$$

The discharge drift $\Delta_{D,j}$ is shown in FIG. 3 for a plurality of values of j.

In a second calculation form, a—nominally identical—discharge capacity $Q_{meas,i}$ is ascertained with equation 6:

$$Q_{meas,i} = Q_{0,2} + \sum_{2}^{i-1} \Delta_{Kap,k} \qquad \text{Equation 6}$$

The capacity loss $\Delta_{Kap,k}$ used here is calculated from the charge drift $\Delta_{C,i}$ and the discharge drift $\Delta_{D,j}$ according to equation 7.

$$\Delta_{Kap,i} = \Delta_{D,j} - \Delta_{C,i} \qquad \text{Equation 7}$$

The discharge drift has already been used and is calculated according to the above equation 5. The charge drift is similarly calculated according to equation 8:

$$\Delta_{C,i} = Q_i - Q_{i-1} \qquad \text{Equation 8}$$

The value $Q_{0,i}$ is thus substantially calculated from such variables as are present in the i-th load cycle. However, the value $Q_{meas,i}$ is calculated from values that result over the whole measuring period between an initial value, in this case for example $Q_{0,2}$ and the i-th load cycle. In the case of an ideal, that is error-free, current measurement, the two values are identical, i.e.

$$Q_{0,i} = Q_{meas,i} \qquad \text{Equation 9}$$

In reality, however, the two values diverge due to the current calibration present in the current measurement, which is not entirely accurate. The greater the difference in the values, the more error-laden the current calibration is.

Equation 9 is used in the form $f = Q_{0,i} - Q_{meas,i}$ as the basis for an optimization in which the function value f is to be minimized. The variables to be varied for the optimization form the current calibration. The current calibration is a mapping of a measured current value onto a corrected measurement value. If, by way of the optimization, an extensive matching between the values $Q_{0,i}$ and $Q_{meas,i}$ is achieved, then the corrected measurement values very accurately correspond to the real current flow.

The current calibration can have, for example, an offset value and a gain. The offset value denotes a constant value by which the measured current is displaced, whereas the gain defines a gradient of the current characteristic. The optimization starts with arbitrary values for the offset and the gain. As a starting value for the offset, 0 is recommended, that is to say no shift. The optimization is typically undertaken in a computer-based manner. For this, known programs can be used to which only the function to be minimized and the boundary conditions and parameters must be fed.

Figure 4:
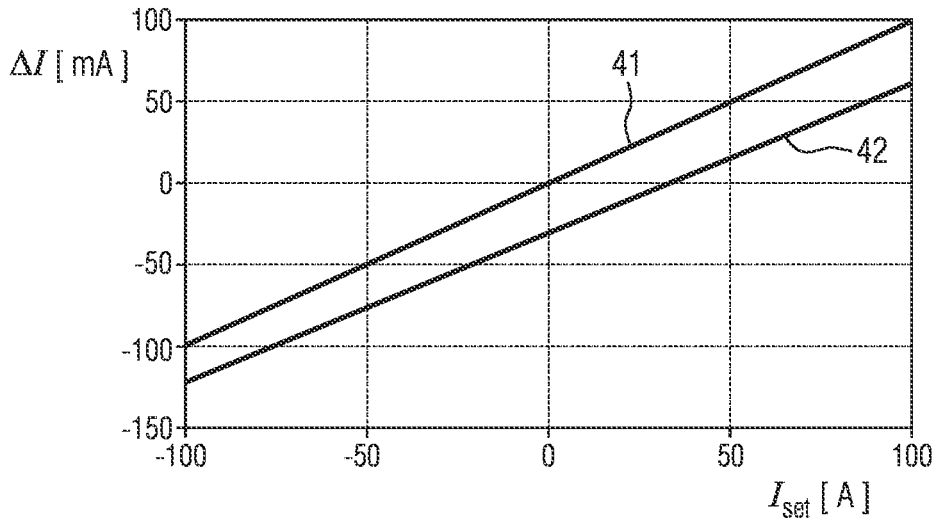
FIG. 4 shows a graph with current calibration characteristic lines before and after the performance of an optimization process incorporating teachings of the present disclosure.

The result of such an optimization is shown in FIG. 4. FIG. 4 shows the straight line 41 which defines the offset and the gain before the optimization, this being a straight line through the origin and having a gradient of 1/1000. FIG. 4 also shows the straight line 42 which results after the optimization. As shown, the optimization leads to an offset of approximately −30 mA and a slight deviation of the gain from 1/1000, that is, a slight rotation of the straight line. With these values for the current calibration, a largely identical value of $Q_{0,i}$ and $Q_{meas,i}$ is achieved.

Since the calibration changes the current values, for the optimization, the integrals (or summations) with which the charge values are formed, that is equations 1 and 2, must be recalculated. The current value which is included in the integral or the summation is changed to $I_{korr}(t) = \text{offset} + \text{gain}*I(t)$. This change, that is the correction of the calibration, therefore influences the resulting charge values, but due to the integral formation, cannot simply be carried out directly on the charge values Q.

In some embodiments, the optimization is carried out on the basis of a measurement which comprises 200 charging cycles. Therein, for an optimum quality of the current calibration, a plurality of value pairs $Q_{0,i}$ and $Q_{meas,i}$, that is a plurality of indices i, are taken into account. For example, the last 50 value pairs can be taken into account from the measurement series with 200 charging cycles.

Figure 5:
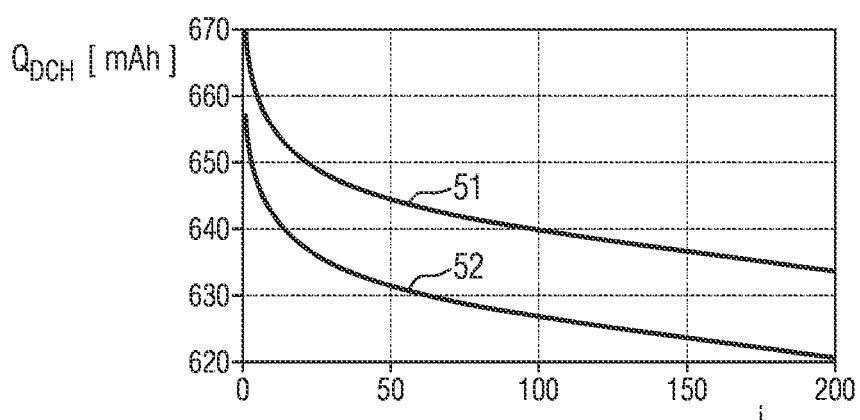
FIG. 5 shows a graph of the discharge capacities before the performance of the optimization process incorporating teachings of the present disclosure.
Figure 6:
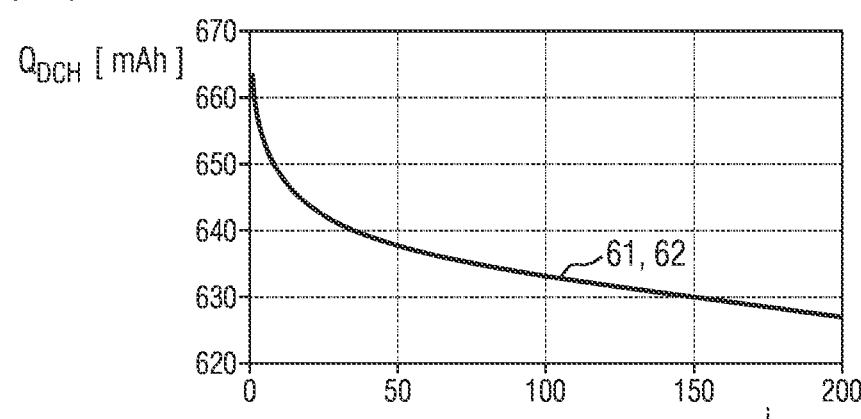
FIG. 6 shows a graph of the discharge capacities after the performance of the optimization process incorporating teachings of the present disclosure.

FIG. 5 shows, for the present example, the progression of the values $Q_{0,i}$ 51 and $Q_{meas,i}$ 52 before the optimization. It is evident that the nominally identical values actually lie approximately 0.15% apart due to a slightly error-prone current calibration. A typical accuracy required for HPC measurements of 0.01% for the current measurement is therefore not achieved. FIG. 6 shows the progression of $Q_{0,i}$ 61 and $Q_{meas,i}$ 62 after the optimization, i.e. with an improved current calibration. It proves to be the case that both progressions become displaced and the progressions 61, 62 coincide almost completely after the optimization, so that a high degree of accuracy in the measurement is achieved. The accuracy thus achieved meets the requirement of an accuracy of 0.01%.

Figure 7:
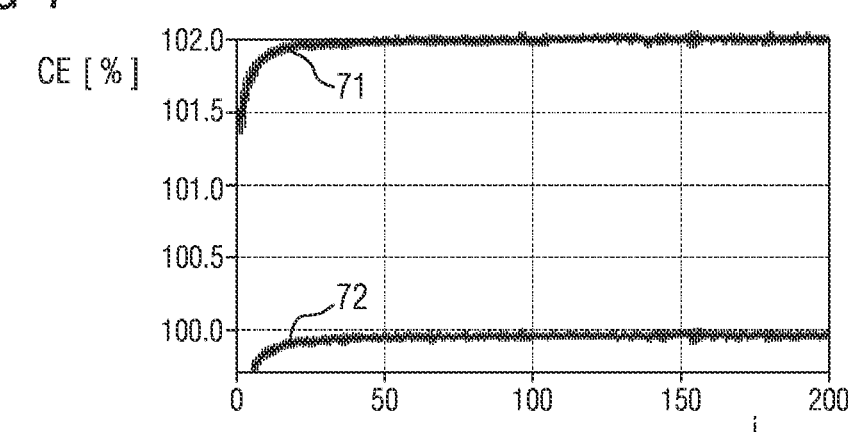
FIG. 7 shows a graph with values for the coulomb efficiency before and after the performance of the optimization process incorporating teachings of the present disclosure.

FIG. 7 shows that the improved current calibration also improves the accuracy of other derived values. The progression shows the behavior of the coulomb efficiency according to equation 4 before the optimization. The coulomb efficiency is approximately 102% for large regions of the measurement, which is not possible since more energy cannot be extracted from the battery than has previously been loaded into it. There is therefore an evident measurement error. After the optimization, however, the progression 72 results in which the coulomb efficiency rises from initially low values to almost 100% for the majority of the measurement. At least there is no obvious measurement error herein.

Even with a result of less than 100% for the coulomb efficiency, a comparison of the absolute values is normally difficult since the measurement error due to the lack of a current calibration is greater than the differences between the battery cells. Since this error is corrected by the invention on every measurement and is therefore almost completely eliminated, even a comparison of the absolute values for the coulomb efficiency is thus enabled.

In some embodiments, the procedure shown contains an implicit validation of the measurement result by way of control of the residue of the optimization. For example, as the target function for the optimization process, the sum of the differences of the two equations 3 and 6 normalized to the mean value of the observed discharging capacity can be implemented for all the measurement points. It is therefore ensured that for all the measurements, regardless of the cell capacity and the depth of discharge, a uniform measure for the quality of the optimum as found is available. The optimizer, for example the MATLAB function "fmincon", can be set, for example, to a quality level of $10^{-6}$ at which the optimization process is ended as successful. If the target value is not achieved or if the optimizer breaks off for some other reason, the measurement should be observed in detail and possibly rejected. Otherwise, the measurement can be classified as valid and its results as significant.

REFERENCE CHARACTERS

1 Apparatus for predicting residual capacity
2 Battery storage device
3 Temperature-controlled chamber
4 High precision coulometry apparatus
10 Computing unit
11 Power cable
12 Data cable
13 Computer program product
21 First state of charge
22 Second state of charge
23 Third state of charge
24 Fourth state of charge
25 Upper voltage
26 Lower voltage
100 Load cycle
$t_C$ Charging period
$t_D$ Discharging period
$Q_{0,2}$, $Q_{0,4}$, $Q_{meas,4}$ Discharging capacities
$\Delta_{D,j}$ Discharge drift
$\Delta_{C,i}$ Charge drift
41 Current calibration before optimization
42 Current calibration after optimization
51, 52 Discharge capacities before optimization
61, 62 Discharge capacities after optimization
71, 72 Coulomb efficiency before and after optimization

The invention claimed is:

1. A method for operating a high-precision coulometry device to ascertain a mean capacity loss of a battery storage device, the method comprising:

applying a plurality of load cycles to the battery storage device;

testing the battery storage device during the plurality of load cycles to measure a current, wherein each of the load cycles includes a charging phase and a discharging phase;

providing a set of results comprising a plurality of values of the measured current;

ascertaining a first discharge capacity and a second discharge capacity of the battery storage device from the set of results using a first calculation rule and a second calculation rule, wherein different calibrations of the current measurement are included in the first calculation rule and the second calculation rule, wherein each calibration is a calculation rule for correcting individual values of the current measurement;

carrying out an optimization process to select a calibration of the current measurement determined to achieve a closest match of the ascertained first discharge capacity and the second discharge capacity; and using the selected calibration to adjust the coulometry device and thereafter measure a further discharge capacity for a further battery storage device.

2. The method as claimed in claim 1, wherein the first discharge capacity for a load cycle is calculated based on a discharge drift for the load cycle and a coulomb efficiency for the load cycle.

3. The method as claimed in claim 1, wherein the first discharge capacity for a load cycle is calculated based on a capacity value after the charging phase of the load cycle and a capacity value before said charging phase.

4. The method as claimed in claim 1, wherein the second discharge capacity for a load cycle is ascertained based on a first discharge capacity for a further preceding load cycle and a sum of capacity losses of load cycles arranged between the load cycle and the further load cycle.

5. The method as claimed in claim 1, wherein, for the calculation and optimization of the calibration, an offset value is used which defines a difference between a raw electrical signal from a measurement and the measured current value at a current of 0 A and a gradient value is used defining a proportionality factor between the two.

6. The method as claimed in claim 1, wherein, for the calculation and optimization of the calibration, a curvature factor is used which defines a non-linear, in particular quadratic, relationship between a raw electrical signal from a measurement and the measured current.

7. The method as claimed in claim 1, wherein, for the calculation and optimization of the calibration, the relation between a raw electrical signal from a measurement and the measured current is modelled as a partially linear relation with at least three interpolation points.

8. The method as claimed in claim 1, wherein charging and discharging of the load cycle takes place between a lower voltage and an upper voltage of the battery storage device.

9. The method as claimed in claim 1, in which in each successive load cycle, a constant temperature prevails within the load cycle.

10. The method as claimed in claim 1, wherein:

a first charge displacement is ascertained as the difference between a first upper state of charge and a second upper state of charge;

a second charge displacement is determined as the difference between a first lower state of charge and a second lower state of charge; and a capacity loss is determined from the difference between the first charge displacement and the second charge displacement.

11. The method as claimed in claim 1, wherein load cycles are carried out until the capacity loss in two or more successive load cycles is almost constant.

12. An apparatus comprising:

a memory store for receiving a set of results for a measurement series on a battery storage device with a plurality of load cycles;

wherein the load cycles each comprise a charging phase and a discharging phase and the results of the set of results each comprise a value of a current measurement; and a computing unit programmed to:

calculate a first discharge capacity and a second discharge capacity of the battery storage device based on the set of results using a first calculation rule and a second calculation rule, wherein different calibrations of the current measurement are included in the first calibration rule and the second calculation rule, wherein each calibration is a calculation rule for correcting individual values of the current measurement;

carrying out an optimization process to select a calibration of the current measurement determined to achieve a closest match of the ascertained first discharge capacity and second discharge capacity;

adjust settings of a high-temperature coulometry device using the selected calibration and operating the device using the adjusted settings.

13. A non-transitory computer program product storing a set of instructions which can be directly loaded into a memory store of a programmable computing unit, the set of instructions causing a processor of the programmable computing unit to:

obtain a set of results of a measurement series on the battery storage device taken during a plurality of load cycles, wherein each of the load cycles includes a charging phase and a discharging phase and the set of results comprises a plurality of values of a current measurement;

ascertain a first discharge capacity and a second discharge capacity of the battery storage device from the set of results using a first calculation rule and a second calculation rule, wherein different calibrations of the current measurement are included in the first calculation rule and the second calculation rule, wherein each calibration is a calculation rule for correcting individual values of the current measurement;

carry out an optimization process to select a calibration of the current measurement determined to achieve a closest match of the ascertained first discharge capacity and the second discharge capacity; and adjust settings of a high-temperature coulometry device using the selected calibration and operating the device using the adjusted settings.

* * * * *